(12) United States Patent
Wu et al.

(10) Patent No.: US 11,081,413 B2
(45) Date of Patent: Aug. 3, 2021

(54) SEMICONDUCTOR PACKAGE WITH INNER AND OUTER CAVITIES

(71) Applicant: Advanced Semiconductor Engineering, Inc., Kaohsiung (TW)

(72) Inventors: Hsin Lin Wu, Kaohsiung (TW); Yu-Hsuan Tsai, Kaohsiung (TW); Chang Chin Tsai, Kaohsiung (TW); Lu-Ming Lai, Kaohsiung (TW); Ching-Han Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/282,147

(22) Filed: Feb. 21, 2019

(65) Prior Publication Data
US 2019/0267298 A1 Aug. 29, 2019

Related U.S. Application Data

(60) Provisional application No. 62/634,659, filed on Feb. 23, 2018.

(51) Int. Cl.
*H01L 23/20* (2006.01)
*H01L 23/043* (2006.01)
*H01L 21/48* (2006.01)
*H01L 23/10* (2006.01)
*H01L 23/26* (2006.01)
*H01L 23/053* (2006.01)

(52) U.S. Cl.
CPC .......... *H01L 23/20* (2013.01); *H01L 21/4803* (2013.01); *H01L 23/043* (2013.01); *H01L 23/053* (2013.01); *H01L 23/10* (2013.01); *H01L 23/26* (2013.01); *B81B 2203/0315* (2013.01)

(58) Field of Classification Search
CPC ... H01L 23/20; H01L 21/4803; H01L 23/043; H01L 23/053; H01L 23/10; H01L 23/26; H01L 2924/1461; B81B 2203/0315
See application file for complete search history.

(56) References Cited

U.S. PATENT DOCUMENTS

| 9,831,151 | B1 * | 11/2017 | Schultz | ............... H01L 23/42 |
| 2006/0078256 | A1 * | 4/2006 | Lee | ............... G02B 26/0808 |
| | | | | 385/33 |
| 2010/0014147 | A1 * | 1/2010 | Pinter | ............... G02B 26/0833 |
| | | | | 359/290 |
| 2012/0140306 | A1 * | 6/2012 | Pinter | ............... G02B 26/0833 |
| | | | | 359/238 |

(Continued)

FOREIGN PATENT DOCUMENTS

JP 6218106 B2 10/2017

OTHER PUBLICATIONS

Han, Bongtae, "Measurements of True Leak Rates of MEMS Packages", Sensors 2012, 12, 3082-3104.

*Primary Examiner* — Peter Bradford
(74) *Attorney, Agent, or Firm* — Foley & Lardner LLP

(57) ABSTRACT

A semiconductor package structure includes a substrate, a semiconductor die, a lid and a cap. The semiconductor die is disposed on the substrate. The lid is disposed on the substrate. The cap is disposed on the lid. The substrate, the lid and the cap define a cavity in which the semiconductor die is disposed, and a pressure in the cavity is greater than an atmospheric pressure outside the cavity.

20 Claims, 14 Drawing Sheets

(56) References Cited

U.S. PATENT DOCUMENTS

| | | | |
|---|---|---|---|
| 2013/0152366 A1* | 6/2013 | Hiroi | B41J 2/473 |
| | | | 29/428 |
| 2013/0242275 A1* | 9/2013 | Kilcher | G02B 5/0231 |
| | | | 353/98 |
| 2014/0231995 A1* | 8/2014 | Ando | B81C 1/00301 |
| | | | 257/741 |
| 2015/0375994 A1* | 12/2015 | Chien | B81C 1/00238 |
| | | | 257/43 |
| 2016/0176703 A1* | 6/2016 | Baillin | B81B 7/0038 |
| | | | 257/682 |
| 2016/0297676 A1* | 10/2016 | Pahl | B81C 1/00825 |
| 2017/0272081 A1* | 9/2017 | Chiang | H01L 23/345 |
| 2018/0269832 A1* | 9/2018 | Obata | H03H 9/0547 |
| 2018/0302725 A1* | 10/2018 | Ginnerup | H04R 1/04 |
| 2019/0164864 A1* | 5/2019 | Arvin | H01L 21/4882 |
| 2019/0172861 A1* | 6/2019 | Hsieh | H01L 23/60 |
| 2019/0198487 A1* | 6/2019 | Udrea | H05B 3/36 |
| 2019/0225486 A1* | 7/2019 | Chien | B81B 7/02 |

\* cited by examiner

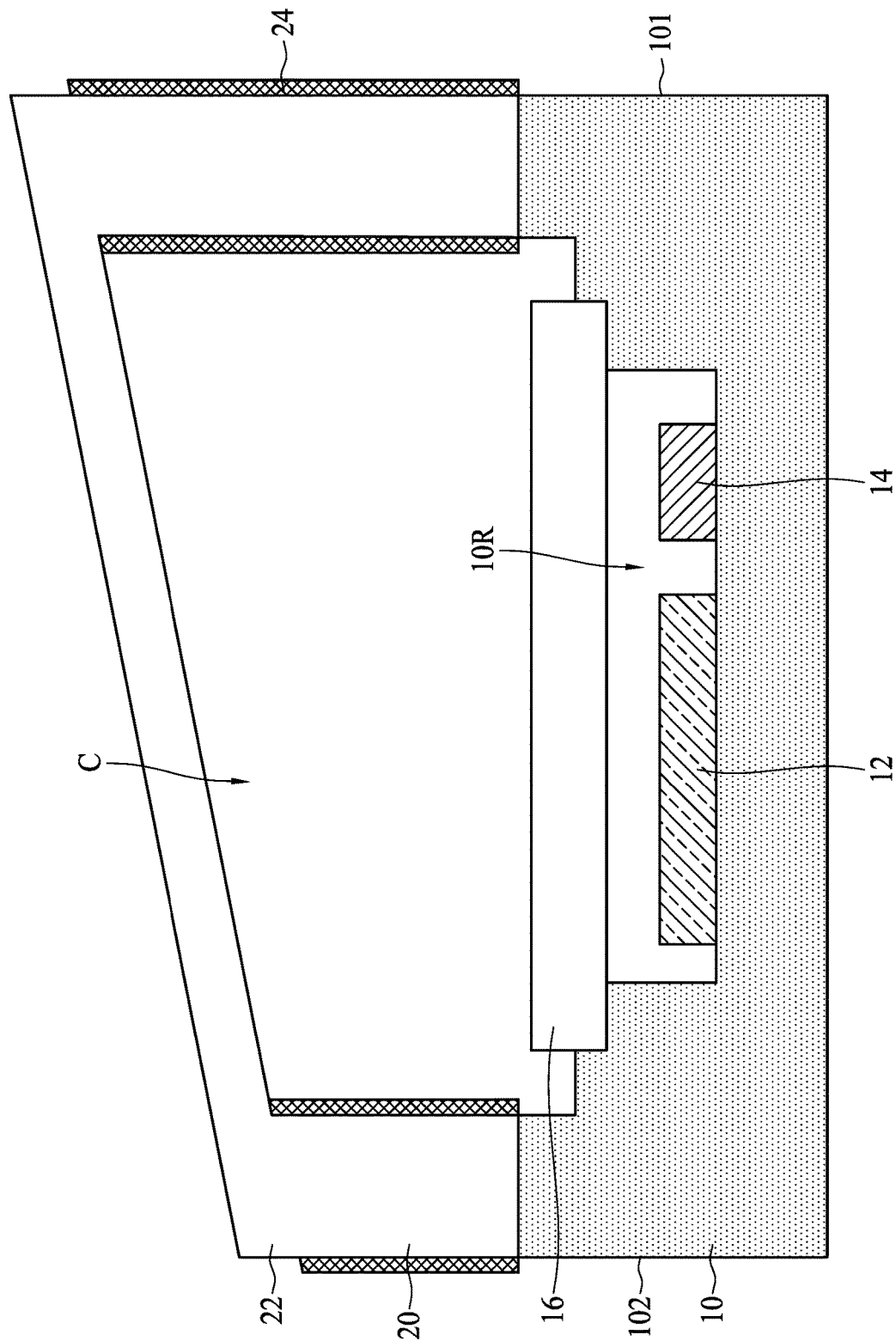

SEMICONDUCTOR PACKAGE WITH INNER AND OUTER CAVITIES

CROSS-REFERENCE TO RELATED APPLICATION

This application claims priority to and the benefit of U.S. Provisional Application No. 62/634,659, filed Feb. 23, 2018, the content of which is incorporated herein by reference in its entirety.

BACKGROUND

1. Technical Field

The present disclosure relates to a semiconductor package structure and method for manufacturing the same, and more particularly to a semiconductor package structure including one or more cavities to hermetically seal a semiconductor die and method for manufacturing the same.

2. Description of the Related Art

Various semiconductor dies such as communication integrated circuit (IC), Micro-electromechanical Systems (MEMS) die and optical die are sensitive and vulnerable to moisture, and thus specify a highly hermetic seal. The effect of hermetic seal of comparative semiconductor package structure is low, which adversely affects the life span and performance of the semiconductor package structure.

SUMMARY

In some embodiments, a semiconductor package structure includes a substrate, a semiconductor die, a lid and a cap. The semiconductor die is disposed on the substrate. The lid is disposed on the substrate. The cap is disposed on the lid. The substrate, the lid and the cap define a cavity in which the semiconductor die is disposed, and a pressure in the cavity is greater than an atmospheric pressure outside the cavity.

In some embodiments, a semiconductor package structure includes a substrate, a semiconductor die, a first lid, a first cap, a second lid and a second cap. The semiconductor die is disposed on the substrate. The first lid is disposed on the substrate. The first cap is disposed on the first lid. The second lid is disposed on the substrate. The second cap is disposed on the second lid and over the first cap. The substrate, the first lid and the first cap define a first cavity in which the semiconductor die is disposed, and the substrate, the first lid, the first cap, the second lid and the second cap define a second cavity.

In some embodiments, a method for manufacturing a semiconductor package structure includes the following operations. A substrate is provided. A semiconductor die is disposed on the substrate. A first cap is formed on the substrate with a first lid interposed between the substrate and the first cap to define a first cavity sealing the semiconductor die, wherein a pressure in the first cavity is different from an atmospheric pressure.

BRIEF DESCRIPTION OF THE DRAWINGS

Aspects of some embodiments of the present disclosure are best understood from the following detailed description when read with the accompanying figures. Various structures may not be drawn to scale, and the dimensions of the various structures may be arbitrarily increased or reduced for clarity of discussion.

FIG. 3 is a cross-sectional view of a semiconductor package structure in accordance with some embodiments of the present disclosure.

DETAILED DESCRIPTION

Figure 1:
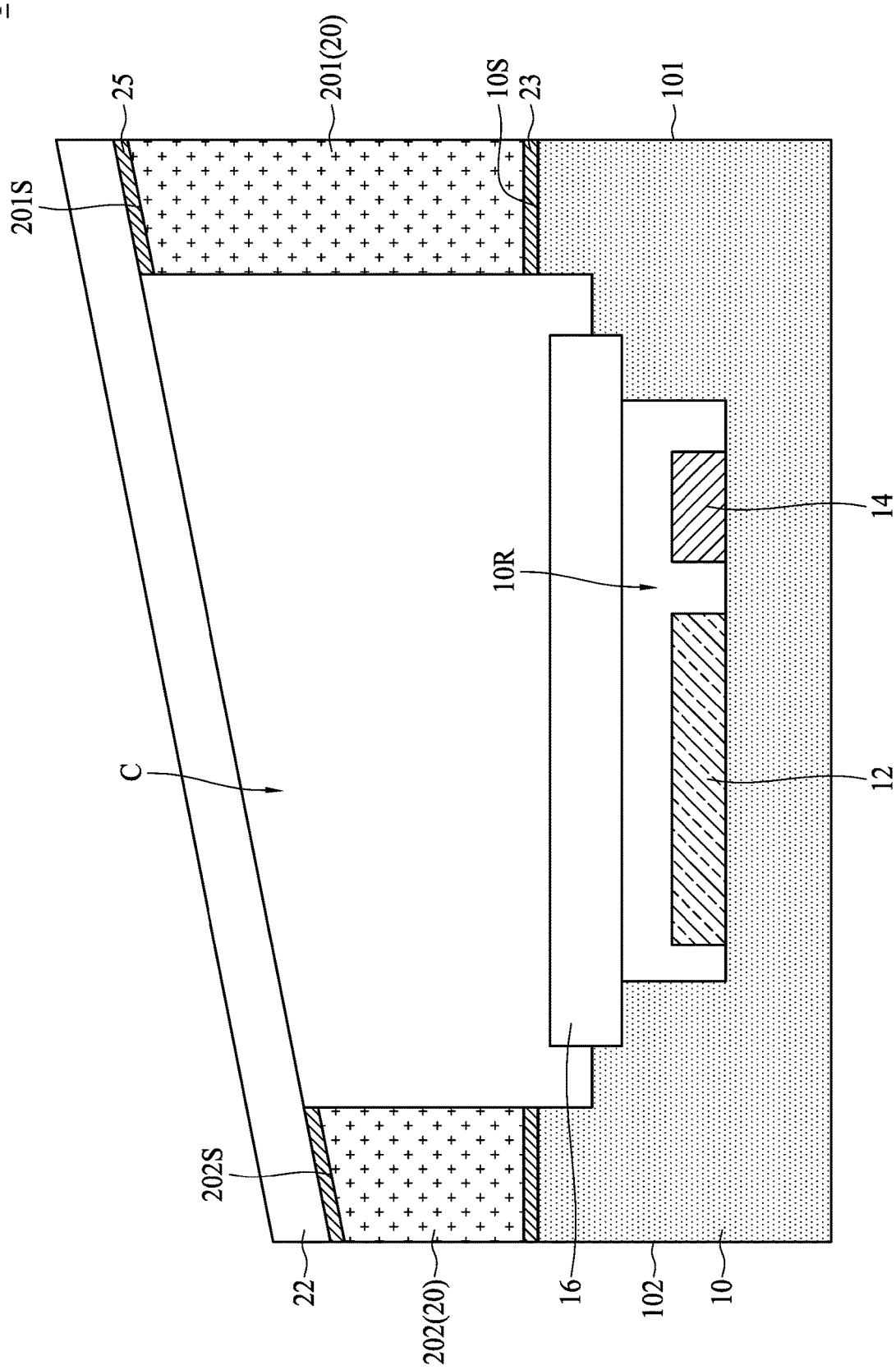
FIG. 1 is a cross-sectional view of a semiconductor package structure in accordance with some embodiments of the present disclosure.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that such arrangement does not deviate from the merits of the embodiments of this disclosure.

A semiconductor package structure includes a substrate, and a semiconductor die disposed on the substrate. The semiconductor package structure may further include a lid and/or a cap to provide hermetic seal for protecting the semiconductor die from moisture, particle(s), dust or other contamination. A seal material, e.g., an adhesive material, a bonding material, may be applied between the substrate and the lid/cap to achieve the hermetic seal. However, certain operation(s) during the process of manufacturing the semiconductor package structure may break the hermetic seal. For example, the hermetic seal may be broken during thermal cycle(s) in the process of manufacturing the semiconductor package structure, which may result in warpage issue, thereby causing leak.

Moisture, particle(s), dust or other contamination may adversely affect performance of the semiconductor package structure. The semiconductor die may include a communication integrated circuit (IC), a Micro-electromechanical Systems (MEMS) die, an optical die, etc. Moisture in the semiconductor package structure may affect the impedance or deteriorate signal transmission of communication IC, and may absorb light or deteriorate signal transmission of optical die. Moreover, the particle(s), dust or other contamination in the semiconductor package structure may change light path.

The present disclosure is directed to a semiconductor package structure and method for manufacturing the same. The semiconductor package structure includes a semiconductor die disposed, one or more lid(s) and one or more cap(s) disposed on a substrate. The substrate, the lid(s) and the cap(s) collectively define at least one hermetic cavity in which the semiconductor die is sealed. The pressure in the cavity is configured to be different from the pressure in the atmospheric environment to reduce leak rate of the hermetic cavity. Accordingly, reliability and life span of the semiconductor package structure can be improved.

FIG. 1 is a cross-sectional view of a semiconductor package structure 1 in accordance with some embodiments of the present disclosure. As shown in FIG. 1, the semiconductor package structure 1 includes a substrate 10, a semiconductor die 12, a lid 20 and a cap 22. The substrate 10 may include but is not limited to, for example, a semiconductor substrate, a ceramic substrate, a lead frame, an interposer, a printed circuit board or the like. Circuitry may be disposed on or embedded in the substrate 10 for electrical connection. The semiconductor die 12 is disposed on the substrate 10. The semiconductor die 12 may include but is not limited to, for example, a communication integrated circuit (IC), a Micro-electromechanical Systems (MEMS) die, an optical die, etc. Example of the communication IC may include a radio frequency (RF) die/chip, a microwave die or the like. Example of the MEMS die may include a MEMS mirror or the like. Example of the optical die may include an infrared radiation (IR) emitter die/chip, an IR sensor die, a non-dispersive Infra-Red (NDIR) emitter die, an NDIR sensor die, a gas sensor die or the like. The semiconductor die 12 may be electrically connected to the circuitry in the substrate 10 by conductive structures such as solder bumps, conductive wires or the like to receive or transmit electrical signals.

In some embodiments, the substrate 10 includes a recess 10R recessed from a surface 10S, and the semiconductor die 12 is disposed in the recess 10R, and lower than the surface 10S. In some alternative embodiments, the surface 10S may include a flat surface. In some embodiments, the opening of the recess 10R has a step profile, and a plate 16 can be disposed over the recess 10R and fixed by the step profile. The plate 16 may include but is not limited to, for example, a transparent plate, a mirror or a filter depended on the specified function of the semiconductor die 12.

The lid 20 is disposed on the substrate 10. The lid 20 includes a frame shape disposed on the periphery of the substrate 10, and surrounding the perimeter of the opening of the recess 10R. By way of example, the lid 20 may include a rectangular frame shape. In some embodiments, the lid 20 is attached to the substrate 10 by an adhesive material 23 such as a hermetic sealing material. In some alternative embodiments, the lid 20 and the substrate 10 can be bonded by directing bonding technique. The lid 20 may include but is not limited to an opaque lid, which can block ambient light. The material of the lid 20 may include but is not limited to insulative material such as plastic material, and/or conductive material such as metal.

The cap 22 is disposed on the lid 20. In some embodiments, the cap 22 is attached to the lid 20 by an adhesive material 25 such as a hermetic sealing material. In some alternative embodiments, the cap 22 and the lid 20 can be bonded by directing bonding technique. The cap 22 may include but is not limited to a transparent cap, which is permeable to light. The material of the cap 22 may include but is not limited to plastic material, glass, quartz or the like. The substrate 10, the lid 20, the cap 22 and the adhesive materials 23 and 25 (if exist) collectively define a cavity C in which the semiconductor die 12 is disposed. The cavity C is hermetically sealed by the substrate 10, the lid 20 and the cap 22 such that the semiconductor die 12 can be protected from being damaged, contaminated or interfered by moisture, particles, dust or the like. The pressure in the cavity C is different from the atmospheric pressure outside the cavity C. For example, the pressure in the cavity C is greater than the atmospheric pressure outside the cavity C. The larger pressure inside the cavity C can expel gases in the environment from entering the cavity C, and thus moisture, particles and dusts can be prevented from entering the cavity C. In some embodiments, the cavity C can be filled with inert gas which has a different gas density from air. Example of the inert gas may include but is not limited to nitrogen gas, argon gas, a combination thereof, or other suitable gases. In some embodiments, the semiconductor package structure 1 may further include a moisture getter 14 disposed in the cavity C to absorb moisture inside the cavity C. In some embodiments, the cap 22 may include but is not limited to, for example a flat cap. In some other embodiments, the cap 22 may include a curved cap such as a hemisphere cap or the like.

In some embodiments, the lid 20 includes a first portion 201 disposed on a first side 101 of the substrate 10, and a second portion 202 disposed on a second side 102 of the substrate 10 opposite to the first side 101. The first portion 201 may be elevationally greater than the second portion 202, and the upper surface 201S of the first portion 201 is higher than the upper surface 202S of the second portion 202. Accordingly, the cap 22 can be disposed on the lid 20 in a tilted manner. The upper surface 201S and the upper surface 202S may each include an inclined surface to fit the surface of the cap 22 arranged in a tilted manner, thereby increasing the hermetic seal effect. The first portion 201 and the second portion 202 may be structurally connected, and the height is varied smoothly from the upper surface 201S to the upper surface 202S to fit the surface of the cap 22, so as to improve hermetic seal effect. The tilt arrangement of the cap 22 may be configured for the specification of some specific semiconductor die 12 such as MEMS die, optical die or the like. The tilt angle of the cap 22 may be modified based on the specification of the specific semiconductor die 12, for example between 30 degrees and 60 degrees, but is not limited thereto.

Figure 2A:
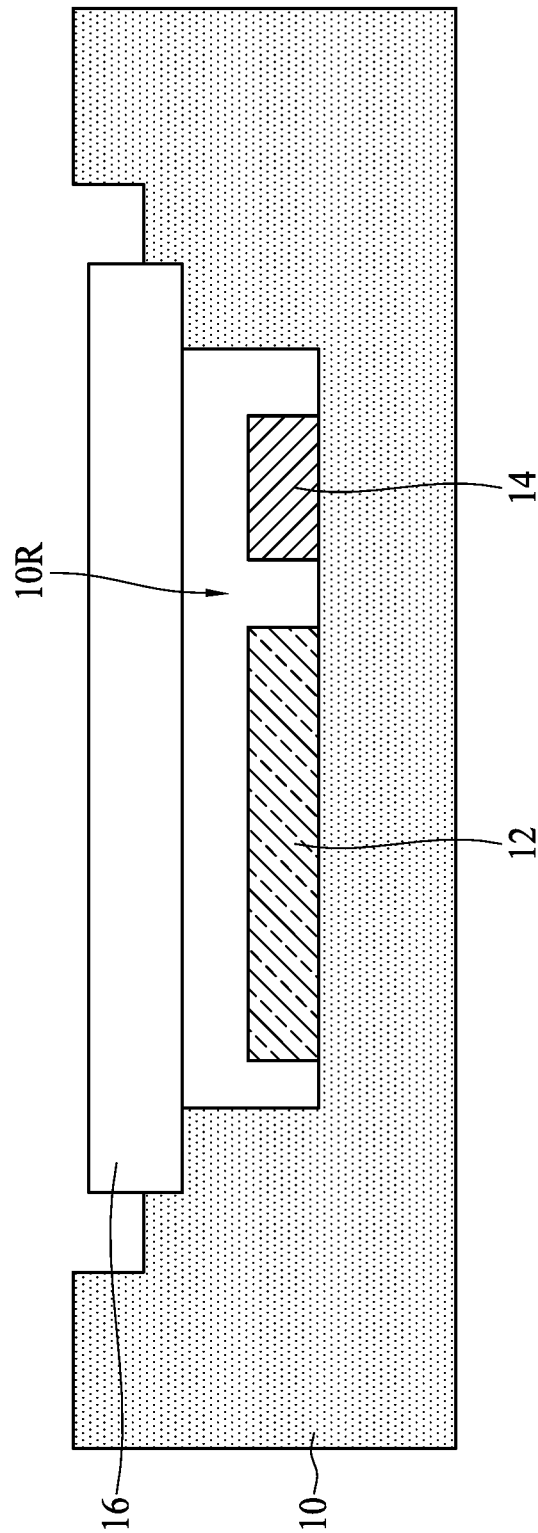
FIG. 2A, FIG. 2B, FIG. 2C, FIG. 2D, FIG. 2E and FIG. 2F illustrate operations of manufacturing a semiconductor package structure in accordance with some embodiments of the present disclosure.

FIG. 2A, FIG. 2B, FIG. 2C, FIG. 2D, FIG. 2E and FIG. 2F illustrate operations of manufacturing a semiconductor package structure in accordance with some embodiments of the present disclosure. Referring to FIG. 2A, a substrate 10 is provided, and a semiconductor die 12 is disposed on the substrate 10. In some embodiments, a recess 10R may be, but is not limited to be, formed in the substrate 10, and the semiconductor die 12 is disposed in the recess 10R. In some embodiments, a moisture getter 14 may be formed on the substrate 10. In some embodiments, a plate 12 may be disposed on the substrate 10 over the recess 10R.

Figure 2B:
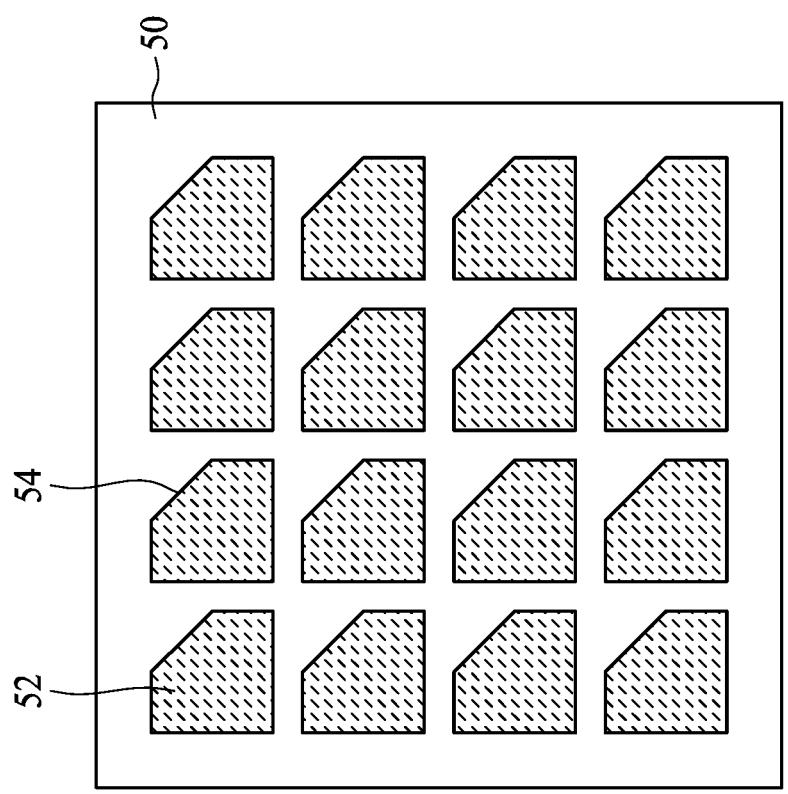
Figure 2C:
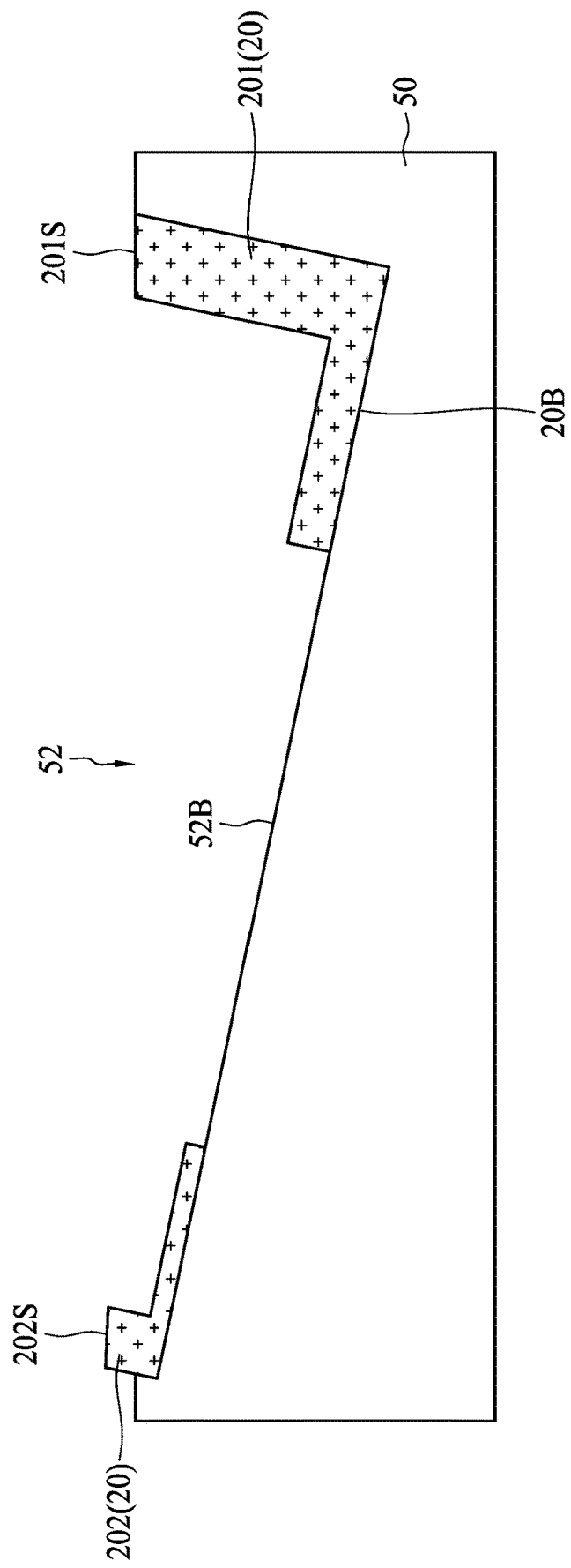

Referring to FIG. 2B and FIG. 2C, a tray 50 is provided, and a plurality of lids 20 are provided. In some embodiments, the lids 20 may include plastic lids, metal lids or the like, and may be formed but is not limited to by injection molding or the like. The lid 20 may include a first portion 201 and a second portion 202 as described. The tray 50 includes a plurality of spaces 52 for placing the lids 20 during fabrication operation. In some embodiments, the space 52 may include a chamfer 54 corresponding to the shape of the lid 20 such that the lid 20 can be placed in a correct orientation. In some embodiments, the lid 20 has an upper surface, for example, the upper surfaces 201S and 202S inclined with respect to a bottom surface 20B. The space 52 of the tray 50 may include an inclined bottom surface 52B having the same slope as that of the lid 20 such that the upper surfaces 201S and 202S are substantially leveled with a horizontal plane when the bottom surface 20B is placed on the inclined surface 52B of the space 52.

Figure 2D:
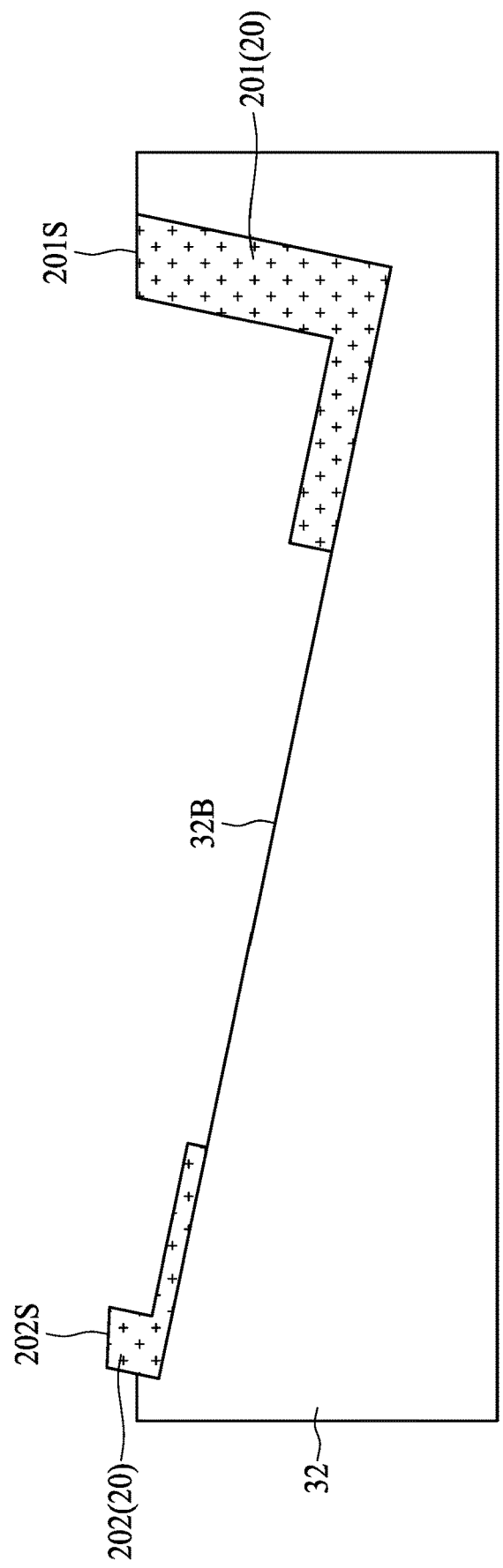

Referring to FIG. 2D, the lid 20 is transferred from the tray 50 to a carrier 32 by, for example, a suction nozzle. The carrier 32 may include an inclined bottom surface 32B having the same slope as that of the lid 20 such that the upper surfaces 201S and 202S are substantially leveled with a horizontal plane when the bottom surface 20B is placed on the inclined surface 32B of the carrier 32.

Figure 2E:
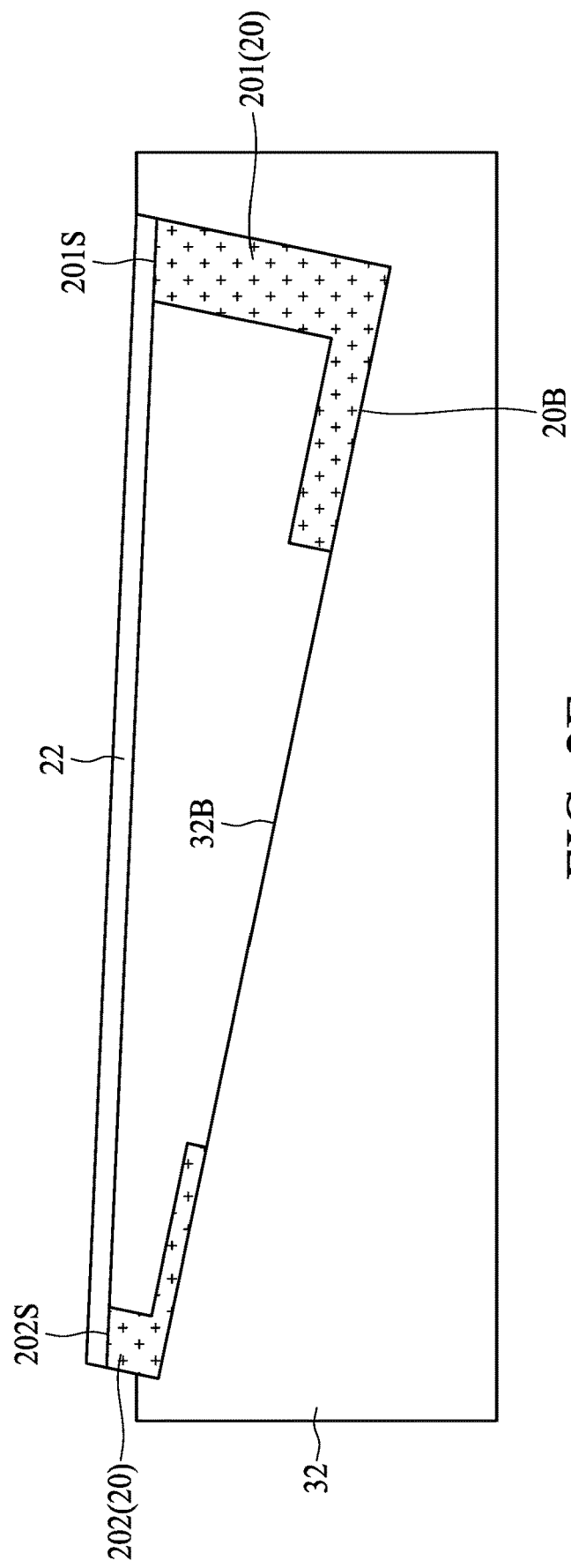
Figure 2F:
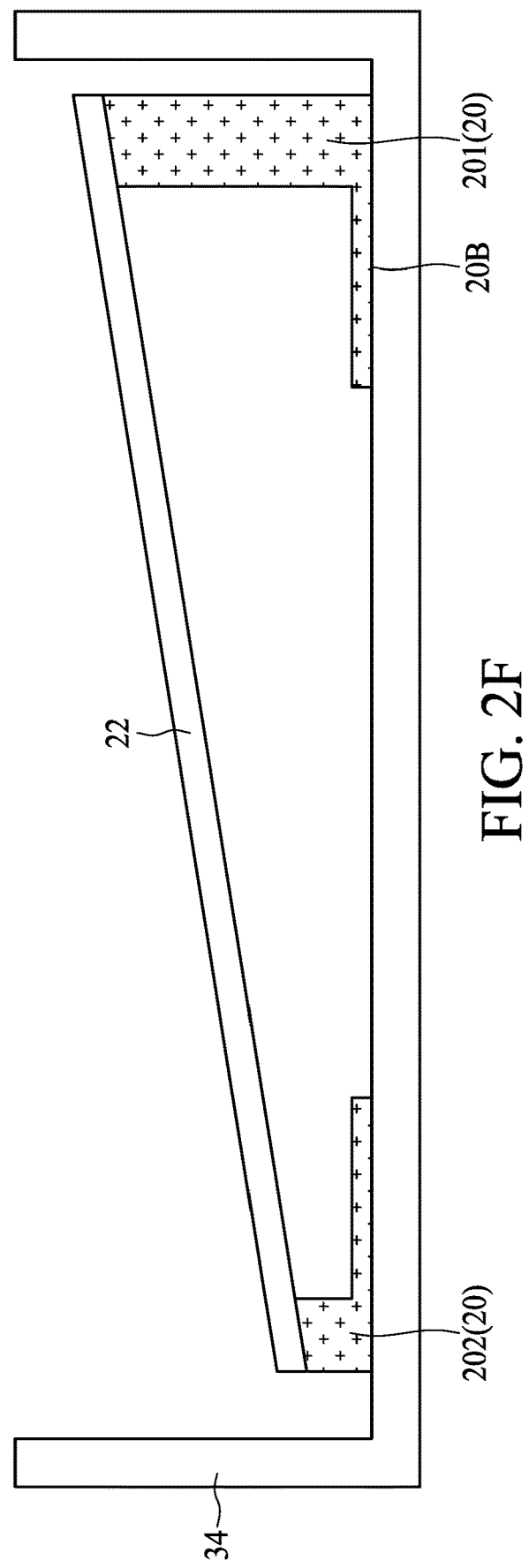

Referring to FIG. 2E, a cap 22 is attached to the upper surfaces 201S and 202S of the lid 20 with an adhesive material (not shown). The upper surfaces 201S and 202S leveled with the horizontal plane facilitates attachment of the cap 22. In some embodiments, the lid 20 with the cap 22 can be optionally transferred from the carrier 32 to another carrier 34 as shown in FIG. 2F. The lid 20 and the cap 22 are picked up and disposed on the substrate 10 with the bottom surface 20B of the lid 20 facing the substrate 10 such that the cap 22 is tilted. Accordingly, the semiconductor package structure 1 is formed.

The semiconductor package structure and manufacturing method of the present disclosure are not limited to the above-mentioned embodiments, and may be implemented according to other embodiments. To streamline the description and for the convenience of comparison between various embodiments of the present disclosure, similar components in each of the following embodiments are marked with same numerals, and are not redundantly described.

FIG. 3 is a cross-sectional view of a semiconductor package structure 2 in accordance with some embodiments of the present disclosure. Referring to FIG. 3, the lid 20 and the cap 22 are a monolithically-formed structure. The monolithically-formed structure may increase hermetic seal effect. In some embodiments, the monolithically-formed structure is transparent. By way of example, the lid 20 and the cap 22 may include a molded glass formed monolithically. In some embodiments, the semiconductor package structure 2 may but is not limited to include a light absorbing layer 24 such as a metal coating layer disposed on at least some lateral sides of the lid 20 to shield light from lateral direction. Adhesive material (not shown) can be used to bond the lid 20 to the substrate 10.

Figure 4:
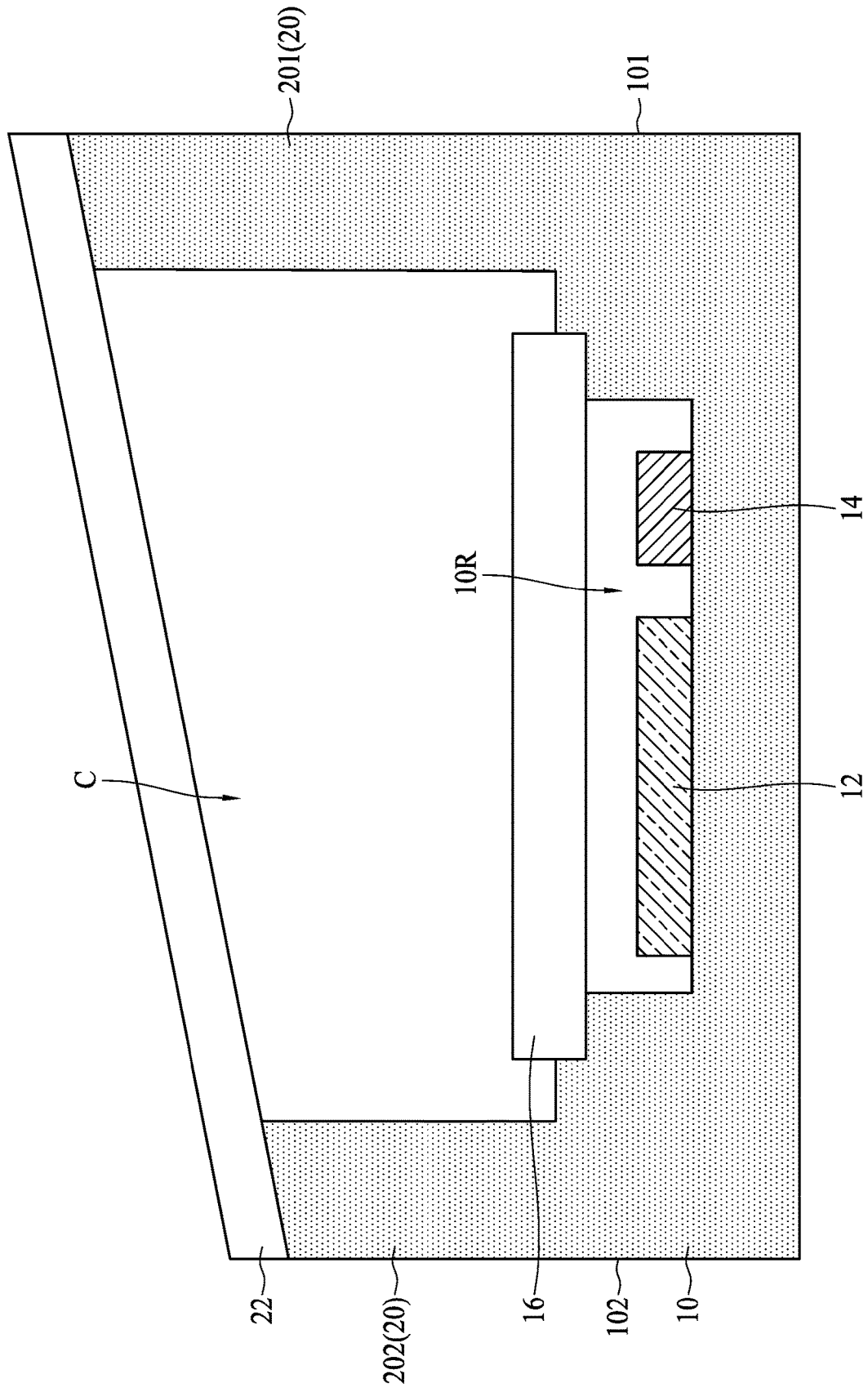
FIG. 4 is a cross-sectional view of a semiconductor package structure in accordance with some embodiments of the present disclosure.

FIG. 4 is a cross-sectional view of a semiconductor package structure 3 in accordance with some embodiments of the present disclosure. Referring to FIG. 4, the lid 20 and the substrate 10 are a monolithically-formed structure. The monolithically-formed structure may increase hermetic seal effect. In some embodiments, the material of the monolithically-formed structure is opaque such as ceramic, to shield light from lateral direction. Adhesive material (not shown) can be used to bond the cap 22 to the lid 20.

Figure 5:
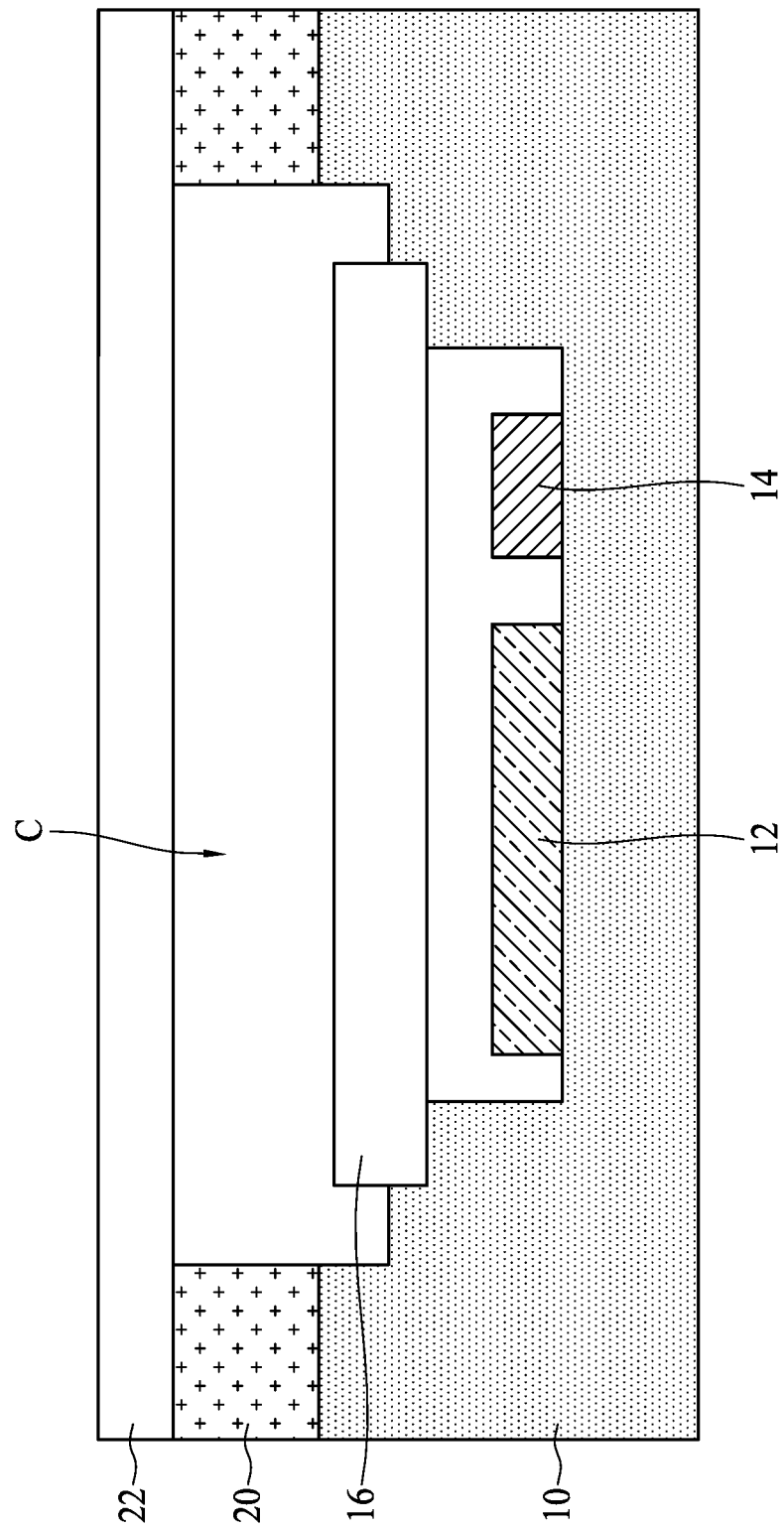
FIG. 5 is a cross-sectional view of a semiconductor package structure in accordance with some embodiments of the present disclosure.

FIG. 5 is a cross-sectional view of a semiconductor package structure 4 in accordance with some embodiments of the present disclosure. Referring to FIG. 5, the lid 20 of the semiconductor package structure 4 may have substantially height, and the cap 22 may be arranged in parallel to a horizontal level.

Figure 6:
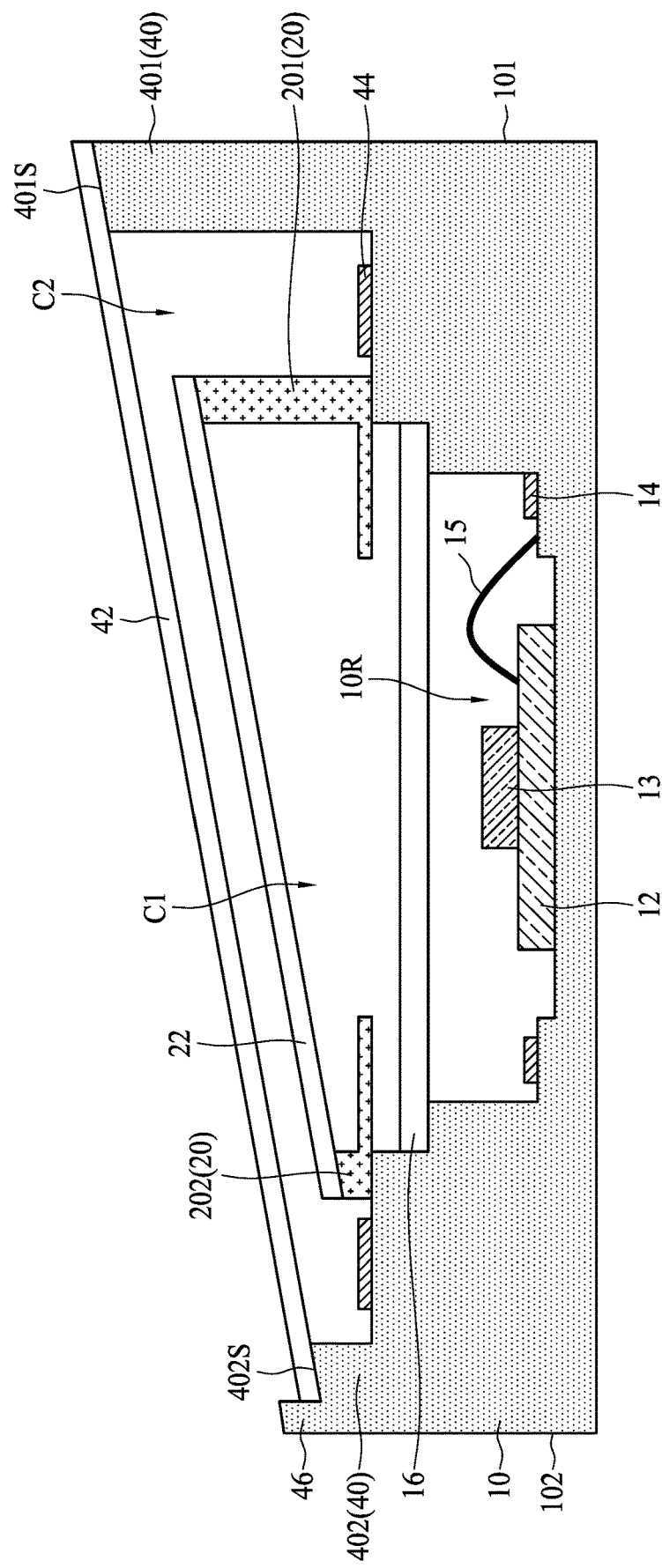
FIG. 6 is a cross-sectional view of a semiconductor package structure in accordance with some embodiments of the present disclosure.

FIG. 6 is a cross-sectional view of a semiconductor package structure 5 in accordance with some embodiments of the present disclosure. Referring to FIG. 6, in addition to the lid 20 (also referred to a first lid) and the cap 22 (also referred to a first cap), the semiconductor package structure 5 further includes a second lid 40 and a second cap 42. The second lid 40 is disposed on the substrate 10. The second cap 42 is disposed on the second lid 40 and over the first cap 22. Adhesive material (not shown) can be used to bond the second cap 42 to the second lid 40. In some embodiments, the second lid 40 is larger than the first lid 20 in dimension, spaced from the first lid 20, and surrounds the first lid 20. As shown in FIG. 6, the substrate 10, the first lid 20 and the first cap 22 collectively define a first cavity C1 in which the semiconductor die 12 is dispose. The substrate 10, the first lid 20, the first cap 22, the second lid 40 and the second cap 42 collectively define a second cavity C2. In some embodiments, the first cap 22 and the second cap 42 each may include but is not limited to, for example a flat cap. In some other embodiments, the first cap 22 and the second cap 42 each may include a curved cap such as a hemisphere cap or the like.

The first cavity C1 is hermetically sealed by the substrate 10, the first lid 20 and the first cap 22 such that the semiconductor die 12 can be protected from being damaged, contaminated or interfered by moisture, particles, dust or the like. The second cavity C2 is hermetically sealed by the substrate 10, the first lid 20, the first cap 22, the second lid 40 and the second cap 42. The second cavity C2 is disposed between the first cavity C1 and the environment to enhance the hermetic seal effect. In some embodiments, the pressure in the first cavity C1 may be substantially the same as the pressure in the second cavity C2. In some embodiments, the pressure in the first cavity C1 is different from the pressure in the second cavity C2. By way of example, the pressure in the first cavity C1 is greater than the pressure in the second cavity C2. The pressure in the second cavity C2 may also be different from the atmospheric pressure outside the second cavity C2. For example, the pressure in the second cavity C2 may be greater than the atmospheric pressure outside the second cavity C2. The larger pressure inside the second cavity C2 can expel gases in the environment from entering the second cavity C2, and thus moisture, particles and dusts can be prevented from entering the second cavity C2. Even though moisture, particles and dusts may enter the second cavity C2 as the hermetical seal effect decays with time, the larger pressure inside the first cavity C1 can expel gases in the second cavity C2 from entering the first cavity C1. Accordingly, moisture, particles and dusts can be prevented from entering the first cavity C1.

The pressures in the first cavity C1 and the second cavity C2 may be individually modified. In some embodiments, the first cavity C1 and the second cavity C2 may be filled with inert gas such as nitrogen gas, argon gas, a combination thereof, or the like. The first cavity C1 and the second cavity C2 may be filled with the same inert gas of the same amount, or different amounts. In some embodiments, the first cavity C1 may be filled with a first inert gas, and the second cavity C2 may be filled with a second inert gas different from the first inert gas. For example, the first inert gas may include but is not limited to argon gas, and the second inert gas may include but is not limited to nitrogen gas. In some embodiments, the first cavity C1 may be filled with inert gas such as nitrogen gas, argon gas or the like, and the second cavity C2 may be a vacuum. In some embodiments, the first cavity C1 and the second cavity C2 may be vacuums to the same extent, or different extents.

In some embodiments, the semiconductor package structure 5 may further include a moisture getter 14 (also referred to a first moisture getter) disposed in the first cavity C1 to absorb moisture inside the first cavity C1. Additionally or alternatively, the semiconductor package structure 5 may further include a moisture getter 44 (also referred to a second moisture getter) disposed in the second cavity C2 to absorb moisture inside the second cavity C2.

In some embodiments, the first lid 20 may include a first portion 201 and a second portion 202 with different heights, and the first cap 22 can be disposed on the first lid 20 in a tilted manner as described. In some embodiments, the second lid 40 may include a first portion 401 disposed on a first side 101 of the substrate 10, and a second portion 402 disposed on a second side 102 of the substrate 10. The first portion 401 may be elevationally greater than the second portion 402, and the upper surface 401S of the first portion 401 is higher than the upper surface 402S of the second portion 402. Accordingly, the second cap 42 can be disposed on the second lid 40 in a tilted manner.

The upper surface 401S and the upper surface 402S may each include an inclined surface to fit the surface of the second cap 42 arranged in a tilted manner, thereby increasing the hermetic seal effect. The first portion 401 and the second portion 402 may be structurally connected, and the height is varied smoothly from the upper surface 401S to the upper surface 402S to fit the surface of the second cap 42, so as to improve hermetic seal effect. The tilt arrangement of the second cap 42 may be configured for the specification of some specific semiconductor die 12 such as MEMS die, optical die or the like. The tilt angle of the second cap 42 may be modified based on the specification of the specific semiconductor die 12, for example between 30 degrees and 60 degrees, but is not limited thereto. In some embodiments, the first cap 22 and the second cap 42 are arranged in parallel, for example, the first cap 22 and the second cap 42 are equally spaced to meet the optical specification of the semiconductor die 12.

In some embodiments, the semiconductor package structure 5 may further include a stopping structure 46 protruding out from the second portion 402 of the second lid 40, and abutting the second lid 42. The stopping structure 46 may be configured to position the second cap 42 and prevent the second cap 42 from sliding downward. In some embodiments, the stopping structure 46 and the second lid 40 may be formed monolithically. Alternatively, the stopping structure 46 and the second lid 40 may be different structures. In some embodiments, the second lid 40 and the substrate are a monolithically-formed structure. The monolithically-formed structure may increase hermetic seal effect. In some embodiments, the second cap 42 may be attached to the second lid 40 by an adhesive material (now shown).

In some embodiments, the semiconductor package structure 5 may include another semiconductor die 13. The semiconductor die 13 may be disposed on and electrically connected to the semiconductor die 12. The semiconductor die 12 and/or the semiconductor die 12 may be electrically connected to the circuitry (not shown) in the substrate 10 by, for example, conductive wires 15 or other conductive structures such as solder bumps.

Figure 7:
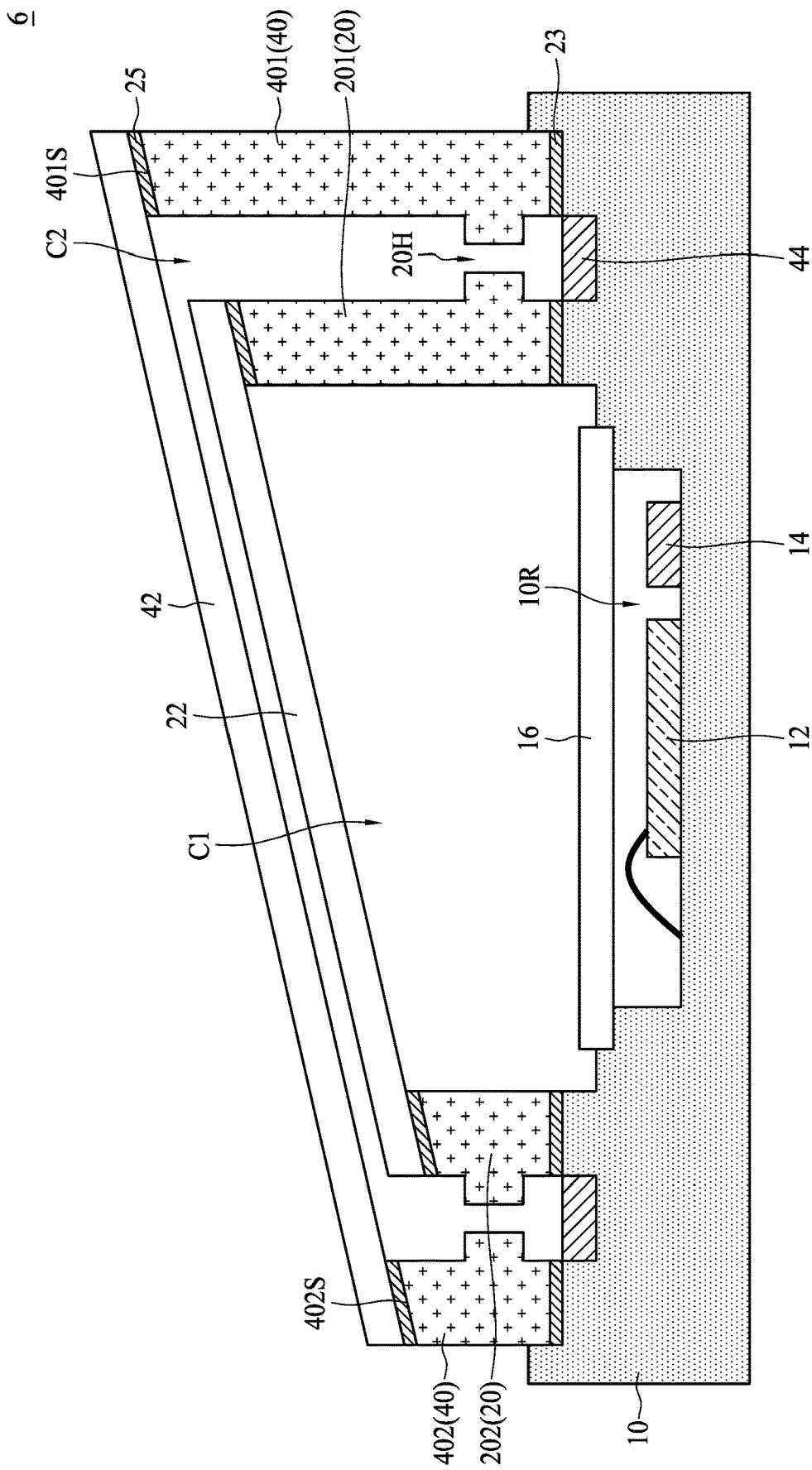
FIG. 7 is a cross-sectional view of a semiconductor package structure in accordance with some embodiments of the present disclosure.
Figure 7A:
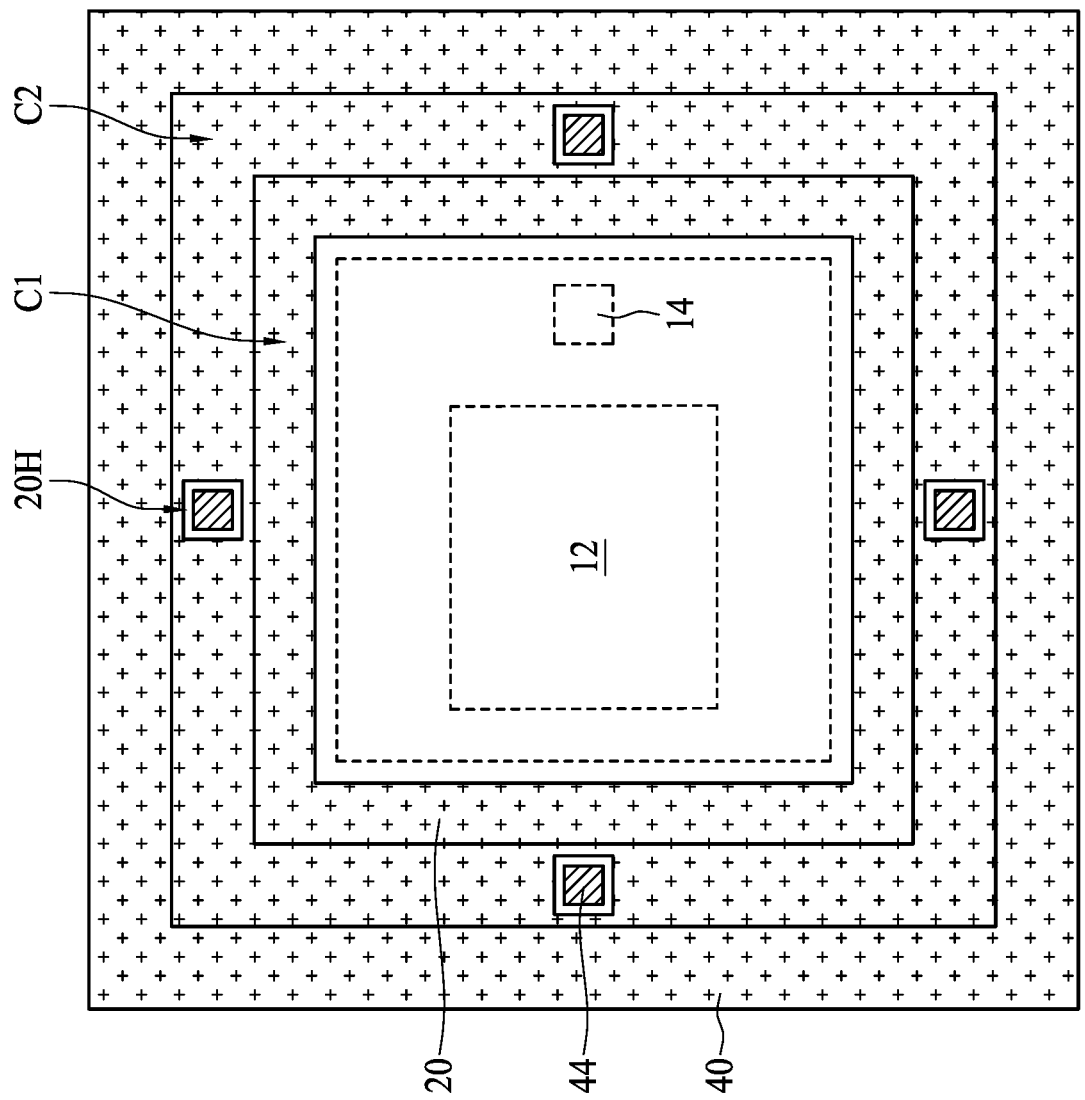
FIG. 7A is a partial top view of a semiconductor package structure in accordance with some embodiments of the present disclosure.

FIG. 7 is a cross-sectional view of a semiconductor package structure 6 in accordance with some embodiments of the present disclosure, and FIG. 7A is a partial top view of a semiconductor package structure 6 in accordance with some embodiments of the present disclosure. Referring to FIG. 7 and FIG. 7A, in contrast to the semiconductor package structure 5 shown in FIG. 6, the first lid 20 and the second lid 40 of the semiconductor package structure 6 are a monolithically-formed structure. In some embodiments, the first lid 20 and the second lid 40 are partially connected, and one or more holes 20H may be formed to expose the second moisture getter 44 disposed on substrate 10 such that moisture in the second cavity C2 can be absorbed by the second moisture getter 44.

Table 1 is a conversion table of leak rates of a semiconductor package structure in accordance with some embodiments of the present disclosure. A semiconductor package structure is determined failed in condition that one cubic centimeter (cc) of gas (e.g. $CO_2$) or moisture ($H_2O$) exists in or enters the cavity of the semiconductor package structure. It is observed that a semiconductor package structure, which has a leak rate at a scale of approximately $1\times10^{-8}$ atm*cc/sec, may have a life span of approximately three years. It is observed that a semiconductor package structure, which has a leak rate at a scale greater than $1\times10^{-8}$ atm*cc/sec, may have a life span which is less than three years.

TABLE 1

| Sample leak rates (atm*cc/sec) | Conversion Result |
| --- | --- |
| $10^{-1}$ | 1 cc leaks every 10 seconds |
| $10^{-3}$ | 1 cc leaks every 17 minutes |
| $10^{-5}$ | 1 cc leaks every 28 hours |
| $10^{-8}$ | 1 cc leaks every 3 years |
| $10^{-9}$ | 1 cc leaks every 30 years |
| $10^{-11}$ | 1 cc leaks every 3000 years |

Table 2 shows a leak rate of two semiconductor package structures in accordance with some embodiments of the present disclosure. In Sample 1, a semiconductor package structure includes a substrate, a semiconductor die disposed on the substrate and a metal (or alloy) lid/cap (e.g. a Kovar lid) disposed on the substrate to cover the semiconductor die. The metal lid/cap may be bonded to the substrate by bonding material, e.g. solder material or other suitable material, to have a hermetic seal. The metal lid/cap, the substrate and the bonding material collectively define or form a single cavity having the same pressure as the atmospheric environment. The experimental result (e.g. by helium leak detection/testing) shows that semiconductor package structure has a leak rate ranged from approximately $1\times10^{-9}$ atm*cc/sec to approximately $1\times10^{-11}$ atm*cc/sec. In Sample 2, another semiconductor package structure includes a substrate, a semiconductor die disposed on the substrate and a plastic lid/cap disposed on the substrate to cover the semiconductor die. The plastic lid/cap may be attached to the substrate by adhesive material or other suitable material to have a hermetic seal. The plastic lid/cap, the substrate and the adhesive material collectively define or form a single cavity having the same pressure as the atmospheric environment. The experimental result (e.g. by helium leak detection/testing) shows that semiconductor package structure has a leak rate ranged from approximately $2.2 \times 10^{-8}$ atm*cc/sec to approximately $3.6 \times 10^{-8}$ atm*cc/sec.

TABLE 2

| Sample | Leak rates (atm*cc/sec) |
|---|---|
| 1. Single cavity (Ceramic substrate + Kovar lid) | $1 \times 10^{-9}$-$1 \times 10^{-11}$ |
| 2. Single cavity (Ceramic substrate + plastic lid) | $2.2 \times 10^{-8}$-$3.6 \times 10^{-8}$ |

Details of the above mentioned experiment or helium leak detection/testing may refer to Han, Bongtae. "Measurements of True Leak Rates of MEMS Packages." Sensors (Basel, Switzerland) 12.3 (2012): 3082-3104. PMC. Web. 26 Dec. 2017. The hermetic seal of each of the semiconductor device packages 1-6 can last 30 years based on MIL-STD-883G.

$$Q_S = \frac{R}{skTPt} \quad (1)$$

wherein the parameters of equation (1) are defined as follows:

Qs=Maximum leak rate allowable, in atm cc/sec Kr, for the devices to be tested.

R=Counts per minute above the ambient background after pressurization if the device leak rage were exactly equal to Qs. This is the reject count above the background of both the counting equipment and the background reading of the microcircuit, if it has been through prior radioactive leak tests.

s=The specific activity, in micro-curies per atmosphere cubic centimeter, of the Krypton-85 tracer gas in the pressurization system.

k=The counting efficiency of the specific scintillation crystal used in the testing to measure Krypton-85 within the internal cavity of the specific component being evaluated. This k-factor should be determined in accordance with 3.2.2 for each device geometric configuration in combination with the specific scintillation crystal in which it will be measured.

T=Soak time, in hours, that the devices are to be pressurized.

P=Pe 2-Pi 2, where Pe is the bombing pressure in atmospheres absolute and Pi is the original internal pressure of the devices in atmospheres absolute. The activation pressure (Pe) may be established by specification or if a convenient soak time (T) has been established, the activation pressure (Pe) can be adjusted to satisfy equation (1).

t=Conversion of hours to seconds and is equal to 3,600 seconds per hour.

Referring back to Table 1, the semiconductor package structure in Sample 1 may have a life span which is greater than three years. The semiconductor package structure in Sample 2 may have a life span of approximately three years. The semiconductor package structure in Sample 1 may have a relatively higher life span, however, at a higher cost as compared to the semiconductor package structure in sample 2 because a metal/alloy lid is relatively expensive than a plastic lid. It may consume relatively great time in manufacturing a metal/alloy lid than a plastic lid. It may consume relatively great time in assembling a metal/alloy lid than a plastic lid. In addition, the metal/alloy lid is not light permeable, and thus is not applicable in some semiconductor package structure.

Figure 8:
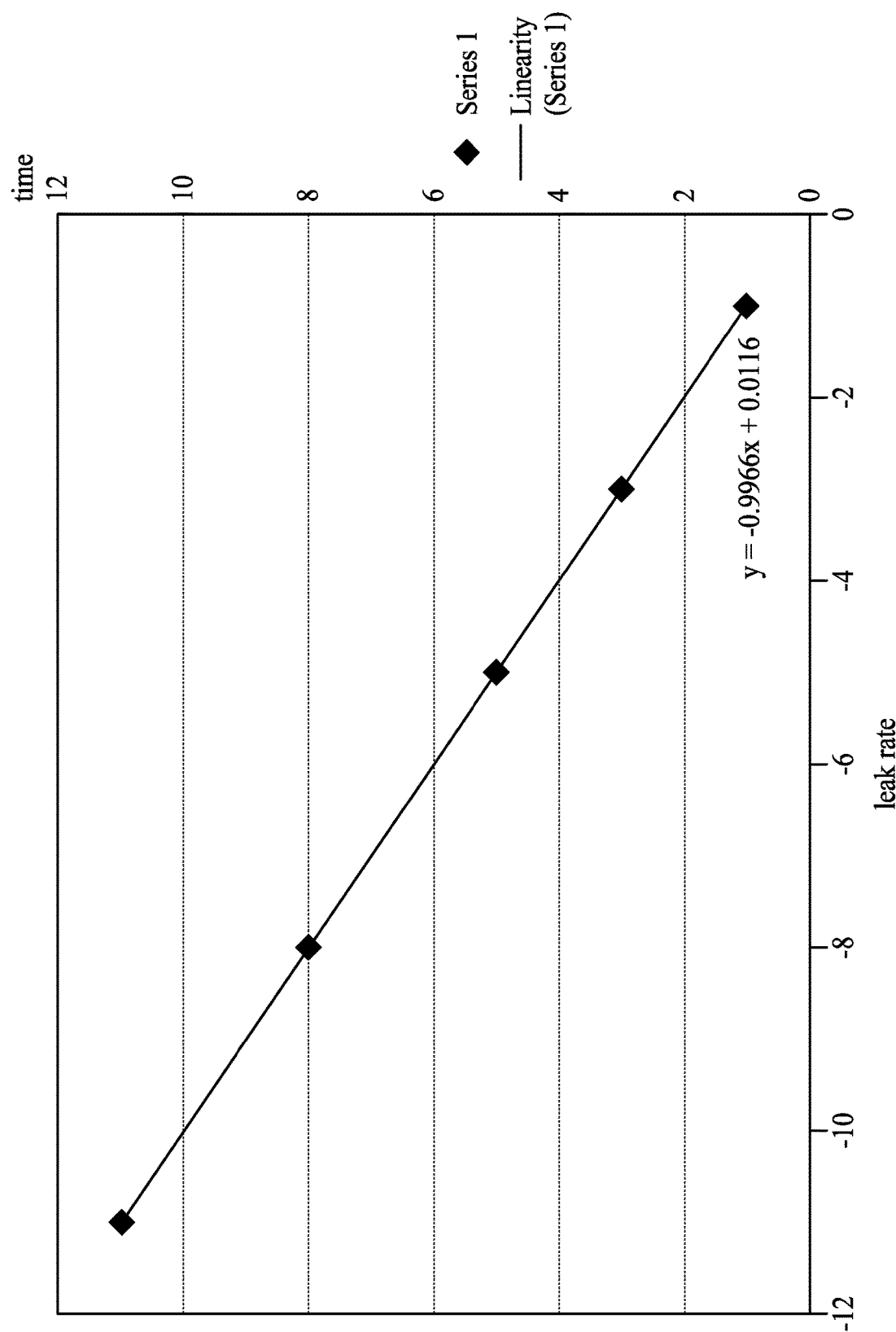
FIG. 8 shows a relation between a life span of a semiconductor device package and leak rate in accordance with some embodiments of the present disclosure.

FIG. 8 shows a relation between a life span of a semiconductor device package and leak rate in accordance with some embodiments of the present disclosure. The experimental result shows that the semiconductor device packages 1-6 each has a leak rate at a scale less than $1 \times 10^{-9}$ atm*cc/sec, and thus has a life span greater than thirty years. The cap(s) of the semiconductor device packages may include non-metal cap(s), and thus the manufacturing cost can be reduced. The semiconductor device packages 1, 2, 3 and 4 include a cavity to hermetically seal the semiconductor die. The pressure in the cavity is configured to be different from the atmospheric environment, which helps to reduce leak rate. The semiconductor device packages 5 and 6 include multiple cavities to hermetically seal the semiconductor die. The multiple-cavity configuration enhances the hermetical seal effect, and thus increases the life span of the semiconductor device package.

In some embodiments of the present disclosure, the semiconductor package structure includes a semiconductor die disposed, one or more lid(s) and one or more cap(s) disposed on a substrate. The substrate, the lid(s) and the cap(s) collectively define at least one hermetic cavity in which the semiconductor die is sealed. The pressure in the cavity is configured to be different from the pressure in the atmospheric environment to reduce leak rate of the hermetic cavity. Accordingly, reliability and life span of the semiconductor package structure can be improved.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor package structure, comprising:
   a substrate;
   a semiconductor die disposed on the substrate;
   a first frame disposed on the substrate;
   a first cap disposed on the first frame;
   a second frame disposed on the substrate; and
   a second cap disposed on the second frame and over the first cap,
   wherein the substrate, the first frame and the first cap define a first cavity in which the semiconductor die is disposed, and the substrate, the first frame, the first cap, the second frame and the second cap define a second cavity, wherein a pressure in the first cavity is different from a pressure in the second cavity.

2. The semiconductor package structure of claim 1, wherein the pressure in the first cavity is greater than the pressure in the second cavity.

3. The semiconductor package structure of claim 1, wherein the first cavity is filled with a first inert gas, and the second cavity is filled with a second inert gas.

4. The semiconductor package structure of claim 1, wherein the first cavity is filled with inert gas, and the second cavity has a vacuum.

5. The semiconductor package structure of claim 1, wherein the second frame and the substrate are a monolithically-formed structure.

6. The semiconductor package structure of claim 1, wherein the first frame and the second frame are a monolithically-formed structure.

7. The semiconductor package structure of claim 1, wherein the first cap and the second cap are arranged in parallel.

8. The semiconductor package structure of claim 1, wherein the first frame includes a first portion disposed on a first side of the substrate, and a second portion disposed on a second side of the substrate opposite to the first side, an upper surface of the first portion is higher than an upper surface of the second portion, and the first cap is disposed on the first frame in a tilted manner.

9. The semiconductor package structure of claim 1, wherein the second frame includes a first portion disposed on a first side of the substrate, and a second portion disposed on a second side of the substrate opposite to the first side, an upper surface of the first portion is higher than an upper surface of the second portion, and the second cap is disposed on the second frame in a tilted manner.

10. The semiconductor package structure of claim 9, further comprising a stopping structure protruding out from the second portion of the second frame, and abutting the second frame.

11. The semiconductor device package of claim 1, wherein the first cavity and the second cavity have a vacuum.

12. The semiconductor device package of claim 1, wherein the substrate includes a recess connected to the first cavity, and the semiconductor die is disposed on a bottom surface of the recess.

13. The semiconductor device package of claim 12, further comprising a mirror disposed in the first cavity and covering the recess.

14. The semiconductor device package of claim 1, further comprising a first moisture getter disposed in the first cavity.

15. The semiconductor device package of claim 14, further comprising a second moisture getter disposed in the second cavity.

16. The semiconductor device package of claim 1, wherein the first cavity and the second cavity are filled with inert gas.

17. The semiconductor device package of claim 1, wherein a pressure in the second cavity is greater than an atmospheric pressure outside the second cavity.

18. The semiconductor device package of claim 9, wherein an upper surface of the first portion and an upper surface of the second portion each includes an inclined surface to fit a surface of the second cap arranged in a tilted manner.

19. The semiconductor device package of claim 6, wherein the first frame and the second frame are partially connected to each other, and a portion of the first frame is disconnected and spaced apart from a portion of the second frame to define a hole exposing a moisture getter disposed on the substrate.

20. The semiconductor device package of claim 1, wherein the semiconductor die is exposed to the first cavity.

* * * * *